(12) United States Patent
Lukitsch

(10) Patent No.: US 9,371,576 B2
(45) Date of Patent: Jun. 21, 2016

(54) COATED TOOL AND METHODS OF MAKING AND USING THE COATED TOOL

(71) Applicant: GM GLOBAL TECHNOLOGY OPERATIONS LLC, Detroit, MI (US)

(72) Inventor: Michael J. Lukitsch, Marysville, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

(21) Appl. No.: 14/332,112

(22) Filed: Jul. 15, 2014

(65) Prior Publication Data

US 2015/0017468 A1 Jan. 15, 2015

Related U.S. Application Data

(60) Provisional application No. 61/846,143, filed on Jul. 15, 2013.

(51) Int. Cl.
| | |
|---|---|
| *C23C 14/06* | (2006.01) |
| *C23C 14/32* | (2006.01) |
| *C23C 14/16* | (2006.01) |
| *C23C 14/35* | (2006.01) |
| *C23C 14/58* | (2006.01) |

(52) U.S. Cl.
CPC .......... *C23C 14/325* (2013.01); *C23C 14/0605* (2013.01); *C23C 14/0635* (2013.01); *C23C 14/165* (2013.01); *C23C 14/35* (2013.01); *C23C 14/5846* (2013.01); *Y10T 428/12576* (2015.01); *Y10T 428/24355* (2015.01); *Y10T 428/265* (2015.01); *Y10T 428/30* (2015.01)

(58) Field of Classification Search
USPC .......... 51/307, 309; 428/216, 336, 408, 469, 428/472, 698
See application file for complete search history.

(56) References Cited

U.S. PATENT DOCUMENTS

| | | | |
|---|---|---|---|
| 4,707,384 A | 11/1987 | Schachner et al. | |
| 4,992,082 A | 2/1991 | Drawl et al. | |
| 5,135,808 A | 8/1992 | Kimock et al. | |
| 5,976,707 A | 11/1999 | Grab | |
| 6,033,533 A | 3/2000 | Sugiyama et al. | |
| 6,087,025 A | 7/2000 | Dearnaley et al. | |
| 6,165,616 A * | 12/2000 | Lemelson ........... | A61F 2/30767 428/336 |
| 6,821,624 B2 * | 11/2004 | Utsumi ............... | C23C 14/024 51/307 |
| 6,881,475 B2 * | 4/2005 | Ohtani ............... | C23C 14/022 428/408 |
| 7,887,919 B2 * | 2/2011 | Yamamoto ......... | C23C 14/022 428/698 |
| 8,057,133 B2 * | 11/2011 | Qi ....................... | B23C 3/00 408/1 R |
| 2005/0014030 A1 | 1/2005 | Usami et al. | |

FOREIGN PATENT DOCUMENTS

| | | | |
|---|---|---|---|
| JP | 2005-177959 | * | 7/2005 |
| JP | 2012161853 | | 8/2012 |

OTHER PUBLICATIONS

Qi et al "Atmospheric effects on the adhesion and friction between non-hydogenated diamond-like (DLC) coating and aluminium-A first principle" Surface Science 600 (2006) p. 2955-2965.*

* cited by examiner

*Primary Examiner* — Archene Turner
(74) *Attorney, Agent, or Firm* — Dierker & Kavanaugh, P.C.

(57) ABSTRACT

An example of the coated tool disclosed herein includes a substrate, a metal layer established on the substrate, a continuous metal carbide layer established on the metal layer, and a smooth, continuous, terminated diamond like carbon (DLC) layer established on the metal carbide layer. The DLC layer is to prevent metal, from a workpiece upon which the tool is to act, from adhering to the tool.

5 Claims, 4 Drawing Sheets

COATED TOOL AND METHODS OF MAKING AND USING THE COATED TOOL

CROSS-REFERENCE TO RELATED APPLICATIONS

This application claims the benefit of U.S. Provisional Patent Application Ser. No. 61/846,143 filed Jul. 15, 2013, which is incorporated by reference herein in its entirety.

BACKGROUND

Tools used in the machining of metals may be exposed to conditions that wear on the tool. Over time, the wear on the tool may alter the tool surface, and may decrease the efficiency of the tool or render the tool unsuitable for use. A variety of coatings have been applied to tools in an effort to increase the usable lifespan of the tool. An example of such a coating is a titanium nitride coating. Titanium nitride coatings reduce wear and retain cutting edges.

SUMMARY

A coated tool is disclosed herein. In an example, the coated tool includes a substrate, a metal layer established on the substrate, a continuous metal carbide layer established on the metal layer, and a smooth, continuous, terminated diamond like carbon (DLC) layer established on the metal carbide layer. The PLC layer is to prevent metal, from a workpiece upon which the tool is to act, from adhering to the tool.

BRIEF DESCRIPTION OF THE DRAWINGS

Features and advantages of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Some metals (e.g., aluminum, magnesium, or the like) are soft and chemically active. These types of metals exhibit a strong tendency to adhere to tool surfaces during machining. The tool(s) disclosed herein include a diamond like carbon (DLC) coating that reduces the adhesion of these types of metals during machining. In the examples disclosed herein, it has been found that a superior DLC coating is obtained when the DLC is terminated with hydrogen and/or hydroxyl groups (either prior to or during tool use).

DLC is generally a tribological material that exhibits the hardness of diamond (e.g., from about 15 GPa to about 100 GPa) and the lubricity of graphite. Examples of the DLC coating disclosed herein exhibit a low hardness (ranging from about 15 GPa to about 25 GPa). This low hardness has been found to be beneficial for fracture toughness, which allows the coated tool to hit inclusions without breaking the DLC coating. While the coefficient of friction ($\mu$) may vary depending upon the atmosphere in which the coated tools are used, examples of the DLC coating disclosed herein are super lubricious and exhibit a coefficient of friction ranging from about 0.01 to about 0.2 when run dry against metal workpieces (see, e.g., FIG. 2).

Figure 1:
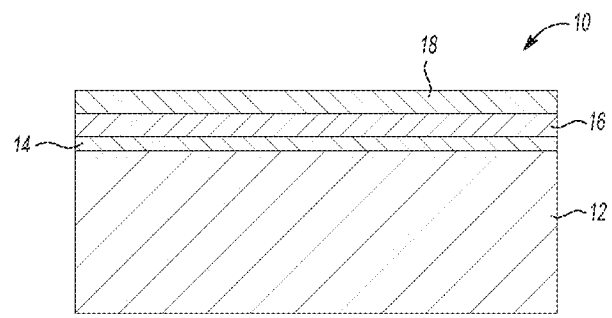
FIG. 1 is a schematic, cross-sectional view of an example of a coated tool formed by an example of the method disclosed herein.

A schematic, cross-sectional view of an example of the coated tool 10 disclosed herein is shown in FIG. 1. The coated tool 10 includes a substrate 12. It is believed that any substrate material that can withstand the low temperature sputtering disclosed herein may be used. As examples, the substrate 12 may be tungsten carbide (WC, also known as cemented carbide) with or without a binder, such as cobalt or nickel; or steel (e.g., high-carbon steel, high speed steel, etc.). The substrate 12 may also contain one or more metals or semi-metals, such as titanium (Ti), chromium (Cr), nickel (Ni), silicon (Si), etc. While not shown in FIG. 1, it is to be understood that the substrate 12 may have the shape of the desired tool, such as a tap, drill bit, end mill, insert, saw blade, grinding wheel, etc.

The substrate 12 may be cleaned prior to coating any additional materials thereon. For example, the substrate 12 may be cleaned in an ultrasonic water bath using detergents, and then the substrate 12 may be rinsed with deionized water.

The substrate 12 is coated with a continuous metal layer 14 and a continuous metal carbide layer 16. Examples of the metal layer 14 include chromium (Cr), titanium (Ti), zirconium (Zr), tungsten (W), nickel (Ni), or combinations thereof. In one example, multiple different metal layers are deposited on the substrate 12. As examples, the substrate 12 may be coated with a layer of chromium, followed by a layer of aluminum or titanium, or the substrate 12 may be coated with a layer of titanium or chromium, followed by a layer of the other of chromium or titanium. Examples of the metal carbide layer include the carbide of any of the previously listed metals (i.e., chromium carbide, titanium carbide, etc.). In an example, the metal layer 14 is titanium and the metal carbide layer 16 is titanium carbide.

In one example, the continuous metal and metal carbide layers 14, 16 are formed by depositing a carbide forming metal (e.g., Cr, Ti, Zr, W, Ni, or combinations thereof) onto the surface of the substrate 12 using magnetron sputtering or another suitable deposition process. Examples of other suitable deposition processes include filtered cathodic arc deposition, cathodic arc deposition, electron-beam (e-beam) evaporation, plasma assisted chemical vapor deposition (PACVD), plasma enhanced chemical vapor deposition (PECVD), chemical vapor deposition (CVD), or hot filament chemical vapor deposition (HFCVD). During deposition of the carbide forming metal, the metal carbide layer 16 automatically forms. The formation of the metal carbide layer 16 may be promoted by biasing the substrate 12, and when magnetron sputtering is used, by selecting a suitable magnetron current. In an example, metal carbide formation may be promoted by using substrate biases from floating {0V} to 200 V with magnetron currents ranging from 0.5 amp to 2 amps.

It is to be understood that magnetron sputtering or some other deposition technique may be accomplished so that all of the carbide forming metal that is deposited is not converted into metal carbide. Magnetron sputtering is a low temperature process (having a temperature less than 180° C.), and under these low temperatures, at least some of the metal remains metal (i.e., is not converted to a carbide). Other deposition methods may also be performed in a manner that ensures that some metal remains on the substrate 12 surface. As an example, ensuring that some of the metal remains on the substrate surface may also be accomplished by decreasing the deposition rate of the metal. Decreasing the deposition rate lowers the temperature and delays the start of striking a plasma on the carbon targets. As an example, any of the deposition processes may be performed so that the metal alone is introduced first, and then as the process continues, the deposition rate of the metal may be decreased while the deposition rate of the carbon may be increased. This creates a gradient from the pure metal to the metal carbide. It may be desirable that at least some of the metal remain (as the metal layer 14) in order to increase fracture toughness and reduce residual stress, thereby increasing adhesion of the layers 14 and 16 to the substrate 12.

Magnetron sputtering of the metal layer 14 and metal carbide layer 16 may take place at micro-torr pressures.

When deposition is complete, some of the metal (i.e., metal layer 14) is present on the surface of the substrate 12 and the metal carbide (i.e., metal carbide layer 16) is present on the metal. In an example, the thickness of the metal layer 14 is 10 nm or less, and the thickness of the metal carbide layer 16 ranges from about 0.01 µm (i.e., 10 nm) to about 0.5 µm (i.e., 500 nm).

An example of the DLC coating 18 is formed on the metal carbide layer 16. In one example, the DLC coating 18 is a smooth, continuous layer formed by magnetron sputtering or filtered cathodic arc deposition. By "smooth", it is meant that the DLC coating 18 is atomically smooth, or has the same surface roughness as the surface upon which the DLC coating is deposited. In an example, the surface roughness of the DLC coating ranges from about 1 nm to about 200 nm. It is to be understood that when magnetron sputtering or filtered cathodic arc deposition is utilized, post-deposition polishing processes are not needed in order to further smooth out the coating 18.

By "smooth", it is also meant that examples of the DLC coating(s) 18 disclosed herein do not include macro-particles and/or craters that are on the order of 300 nm or greater. This is unlike comparative diamond like carbon coatings that are formed, for example, via cathodic arc deposition. During cathodic arc deposition, macro-particles of the carbon target material used to deposit the coating form on the surface of this type of DLC coating. The macro-particles have a size ranging from about 300 nm to about 2 µm. Post-deposition processes may be used to remove these macro-particles, however, these post-deposition polishing processes may form craters (similar in size to the removed macro-particle) in the DLC coating where the macro-particles had been present. In general, the defects associated with cathodic arc deposition are not present in the DLC coating(s) 18 disclosed herein.

It is believed that the DLC coating 18 disclosed herein may be formed using cathodic arc deposition, e-beam evaporation, PACVD, PECVD, CVD, or HFCVD. With these deposition techniques, the previously mentioned macro-particles may be formed, and post-deposition processes (e.g., polishing) may be used to smooth out the DLC coating 18. The surface roughness of the DLC coating 18 formed using any of these techniques may not be as smooth as the DLC coating 18 formed using magnetron sputtering.

Examples of the DLC coating 18 disclosed herein are terminated with i) dangling bonds to be passivated with hydrogen atoms and hydroxyl groups, ii) hydrogen atoms, or iii) hydrogen atoms and hydroxyl groups. The passivation of dangling bonds may take place during use of the tool 10 in an aqueous machining fluid. The termination of the DLC coating 18 with hydrogen atoms, or with hydrogen atoms and hydroxyl groups may take during the manufacturing of the tool 10. It is believed that once terminal hydrogen or hydrogen and hydroxyl groups are present, these atoms/groups stop aluminum, magnesium, and other soft metals from adhering to the coated tool 10.

In an example, DLC coating 18 is a non-hydrogenated DLC layer that is terminated with dangling (i.e., open, unsatisfied, etc.) bonds. The non-hydrogenated DLC layer is formed by performing magnetron sputtering (or another suitable deposition technique) of a graphite target onto the metal carbide layer 16 in the absence of a hydrocarbon precursor (e.g., acetylene, butane, etc.). These dangling bonds may be terminated with hydrogen and hydroxyl groups in a subsequent manufacturing step (i.e., pre-use passivation), or during the first use of the coated tool 10 in machining (i.e., during use passivation). In either example, the dangling bonds are exposed to an aqueous medium (e.g., a 4% to 10% solution of HOCUT®, Houghton International, or another like aqueous medium). The dangling bonds will dissociate the water molecules present in the aqueous medium, leading to the termination of the bonds with hydrogen (H) or a hydroxyl group (—OH).

When the dangling bonds are passivated prior to the use of the tool 10 in a machining process, the mixed termination is believed to saturate the atomic surface of the DLC coating 18. Due to the saturation of the dangling bonds with H and —OH groups, the DLC coating 18 is able to prevent any metal from finding any dangling bonds to attach to.

When the dangling bonds are passivated during the use of the tool 10 in a machining process, the aqueous medium may be an aqueous cutting or machining fluid. In this example, the dangling bonds are not passivated prior to tool 10 use, and thus the dissociation of the water molecules and attachment of hydrogen and hydroxyl groups takes place upon exposure of the tool 10 (including the DLC coating having dangling bonds) to the aqueous cutting or machining fluid while a workpiece is being machined. In this example, since passivation takes place during machining of the workpiece, some of the dangling bonds may become attached to the workpiece metal. However, the dissociation of the water molecules occurs relatively rapidly, and it is believed that this is a viable method for passivating the DLC coating 18 with hydrogen and hydroxyl groups for substantially preventing metal adhesion to the tool 10.

In an additional example, the DLC coating 18 is a hydrogenated DLC layer that is terminated with hydrogen atoms. The hydrogenated DLC layer is formed by first performing magnetron sputtering (or another suitable deposition technique) of the graphite target onto the metal carbide layer 16 in the presence of a source of hydrogen (e.g., a hydrocarbon such as acetylene, butane, diatomic hydrogen ($H_2$), etc.). The hydrocarbon is cracked by applying a potential under vacuum, and the resulting hydrogen atoms attach to the dangling bonds of the DLC layer 18. It is believed that pure hydrogen termination saturates the atomic surface of the DLC coating 18. Due to the saturation of the dangling bonds with H atoms, the DLC coating 18 is able to prevent any metal (e.g., from the workpiece) from finding any dangling bonds to attach to during machining. A pure hydrogen terminated DLC coating may be harder than a mixed hydrogen and hydroxyl group terminated DLC coating.

In the examples disclosed herein, the DLC layer 18 has a thickness ranging from about 0.5 µm to about 6 µm.

To further illustrate the present disclosure, examples are given herein. It is to be understood that these examples are provided for illustrative purposes and are not to be construed as limiting the scope of the disclosed example(s).

EXAMPLES

Example 1

Tungsten carbide disks and tools were cleaned in a series of ultrasonic baths that included first a solution of an industrial degreaser (Blue Gold) followed by a deionized water rinse, and then an industrial cleaner (Contrad 70) followed by a deionized water rinse.

The disks and tools were then loaded into a Closed Field Unbalanced Magnetron Sputtering system and pumped down to a vacuum in the $10^{-6}$ torr range. The chamber was backfilled with 99.99% pure argon to a pressure of 2 to 5 milli-torr. The disks and tools were plasma-etched by striking a plasma over graphite and titanium targets by applying a 400 volt potential at approximately 0.3 amps for 30 minutes. A titanium interlayer was then deposited. by increasing the titanium target current to 4 amps.

A non-hydrogenated DLC was deposited by ramping down the current on the titanium target while increasing the current to the graphite targets to 4 to 6 amps. Prior to the formation of the non-hydrogenated DLC, a titanium carbide interlayer was also formed during this step. A hydrogenated DLC was made following a similar method, except that a hydrocarbon gas (acetylene) was also flowed into the chamber at 10 sccm (standard cubic centimeters per minute). The DLC depositions continued for 6 to 8 hours, resulting in a coating thickness ranging from 2 µm to 4 µm.

The coated disks and tools were held under vacuum for two hours while they cooled from approximately 180° C. and then vented to atmosphere with nitrogen.

Figure 2:
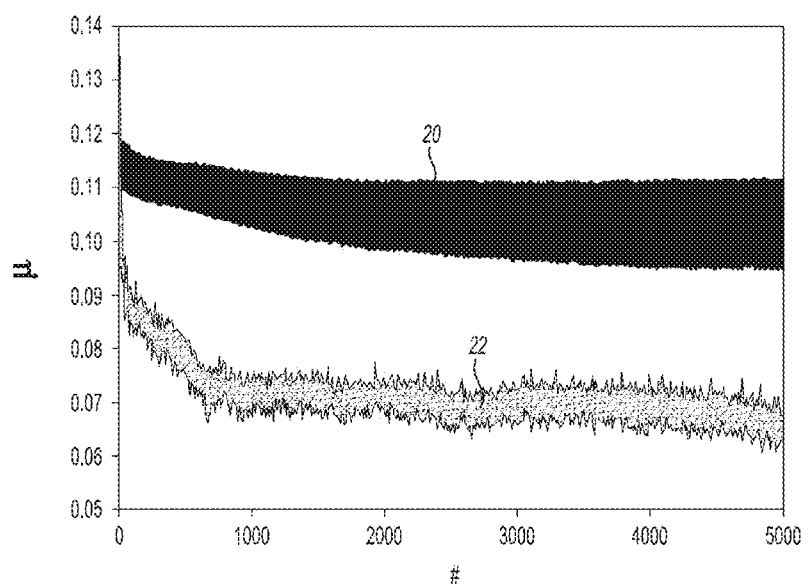
FIG. 2 is a graph illustrating the coefficient of friction ($\mu$) between examples of the diamond like carbon coating disclosed herein and aluminum in a machining fluid.

In each sliding cycle, 319 aluminum pins (3 mm) were run at 1 N load against the hydrogenated and the non-hydrogenated DLC coated disks under fully lubricated conditions using 10% metal cutting fluid in water. The number of sliding cycles was up to 5,000. The coefficient of friction (µ) was measured and the results are shown in FIG. 2. In particular, FIG. 2 illustrates the coefficient of friction (µ) on the Y axis and the number of sliding cycles (#) on the X axis. As illustrated, both the hydrogenated DLC coated disks (H-DLC, labeled 20 in FIG. 2) and the non-hydrogenated DLC coated disks (NH-DLC, labeled 22 in FIG. 2) exhibited a desirably low coefficient of friction.

Figure 3:
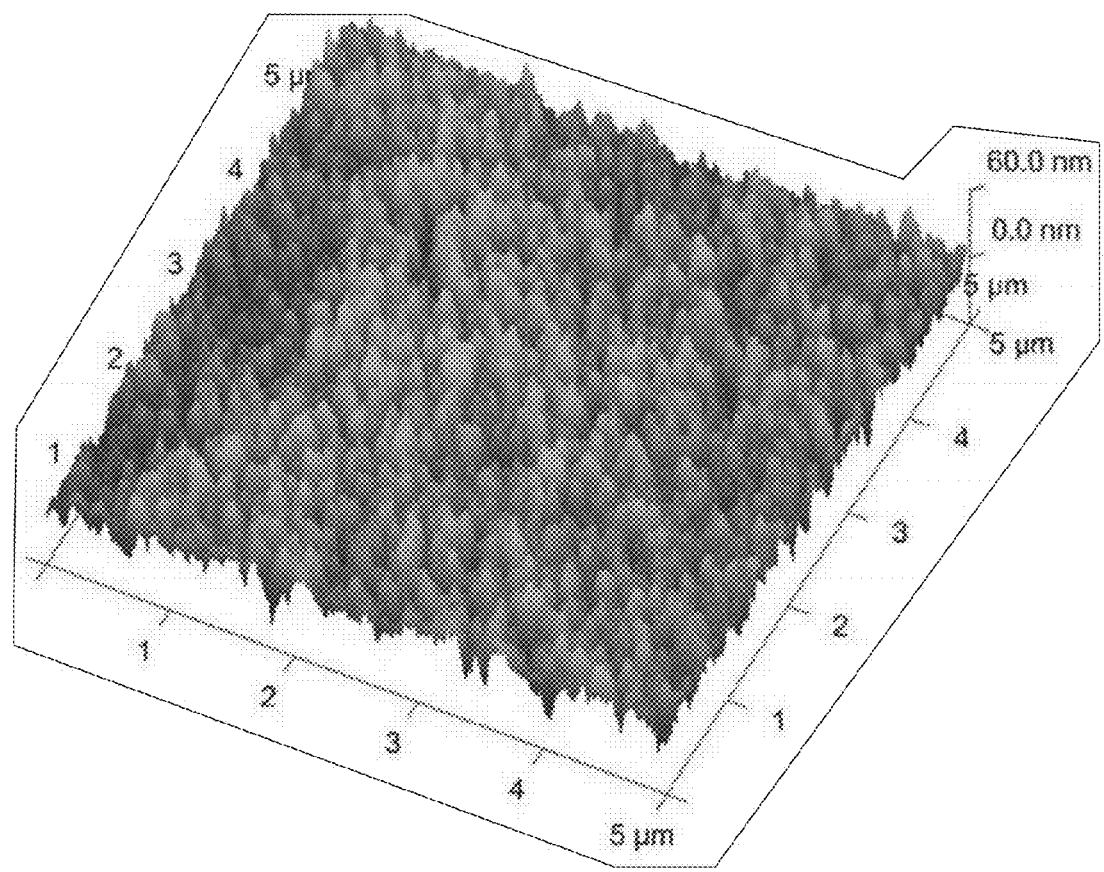
FIG. 3 is an atomic force microscope (AFM) image illustrating the surface topology of an example of the diamond like carbon coating disclosed herein.

Atomic force microscopy (AFM) was used to characterize the surface of the non-hydrogenated DLC coated disk. AFM was performed in tapping mode with a 5×5 micron scan size. The AFM image is shown in FIG. 3. In particular, FIG. 3 illustrates the fine surface topology of the non-hydrogenated DLC coating. The results indicated that the Ra=9 nm.

Example 2

Various drilling, tapping, and milling trials were performed in this Example.

Drilling trials were performed with multiple uncoated tools and multiple non-hydrogenated DLC coated tools. The uncoated tools were 2 flute solid carbide twist step drills and the coated tools were 2 flute solid carbide twist non-hydrogenated DLC coated step drills. The non-hydrogenated DLC coated tools had a titanium interlayer and a hardness of about 20 GPa. These drilling trials involved: 6.8 mm cutting diameter; cutting speed 403 m/min; spindle speed 20,000 RPM; cutting feed 0.06 mm/z; feed 0.17 mm/0.4 revolution; and coolant volume 16 L/min at 40 bar. During the trials, a particular drill was utilized until it broke, and then the drill was replaced with a new drill. For each drill, the number of days was recorded that the drill was used until breakage.

Figure 4A:
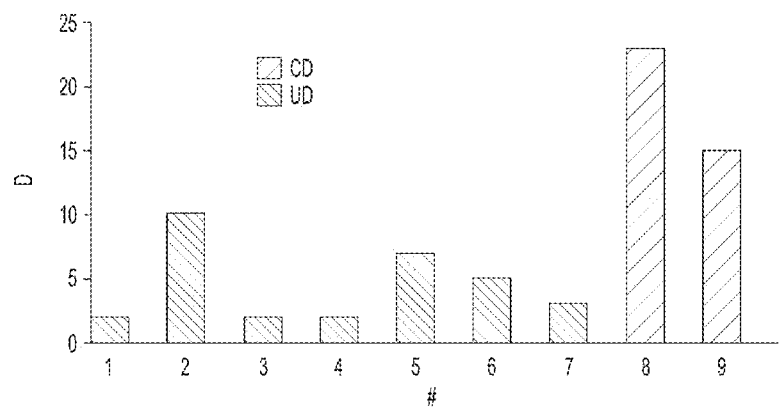
FIGS. 4A and 4B are graphs depicting, respectively, drill breakage and tap breakage results for example non-hydrogenated DLC coated drills (CD) and taps (CT) and comparative, uncoated example drills (UD) and taps (UT)

The breakage results for a representative sampling of the uncoated drills (UD) and coated drills (CD) are shown in FIG. 4A. In FIG. 4A, the tool (drill) number (#) is on the X axis and the number of days (D) that the drill was used/run until breakage is on the Y axis. As illustrated, the uncoated drills (UD) broke in 10 days or less. In contrast, the non-hydrogenated DEC coated drills (CD) did not break until well over 10 days. The results for tool number 9 were still being performed when the data in FIG. 4A was recorded, and the drill actually had not broken at this time. As such, tool number 9 did not exhibit breakage for at least 15 days.

In addition, the coated drills (CD) showed fewer signs of wear when compared to the non-coated drills (CD) performing similar machining. The coated drills (CD) also exhibited sharper corners and points over time, and also had less pickup of the workpiece material on the cutting edge than the non-coated drills (UD).

Tapping trials were performed with multiple uncoated tools and multiple non-hydrogenated DLC coated tools. The uncoated tools were M8×1.25–6H carbide taps and the coated tools were M8×1.25–6H carbide non-hydrogenated DLC coated taps. The non-hydrogenated DLC coated tools had a titanium interlayer and a hardness of about 20 GPa. These tapping trials involved: 8 mm cutting diameter; cutting speed 64 m/min; spindle speed 2500 RPM; cutting feed 1.25 mm/z; feed 1.25 mm/revolution; and coolant volume 16 L/min at 40 bar. During the trials, a particular tap was utilized until it broke, and then the tap was replaced with a new tap. For each tap, the number of days was recorded that the tap was used until breakage.

Figure 4B:
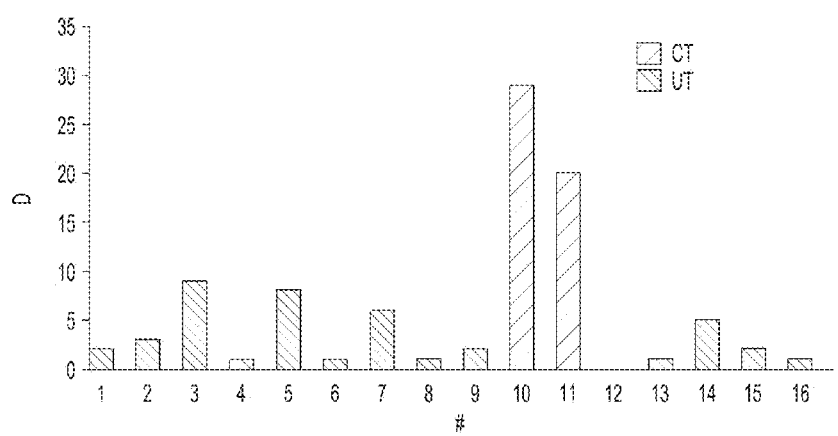

The breakage results for a representative sampling of the uncoated taps (UT) and the coated taps (CT) are shown in FIG. 4B, in FIG. 4B, the tool (tap) number (#) is on the X axis and the number of days (D) that the tap was used/run until breakage is on the Y axis. As illustrated, the uncoated taps (CT) broke in 10 days or less. It is noted that tool 12 broke within the day's production, and thus is shown as zero days until breakage. in contrast, the non-hydrogenated DLC coated taps (CT) did not break until well over 10 days. These results illustrate that the coated tools (CT) used in the tapping trials exhibited an increased life and a reduction in breakage compared to the non-coated tools (UT).

Furthermore, the DLC coated taps (CT) also exhibited fewer signs of wear and had less pickup of the workpiece material on the cutting edge than the non-coated taps (UT).

Milling trials were performed on thousands of parts with three coated milling tools. The coated milling tools were 6 flute solid carbide coated with a non-hydrogenated DLC coating and a titanium interlayer. The coated tools exhibited a hardness of about 20 GPa. These milling trials involved: 3 degree dish, R0.54+/−0.3 coated mill; 10.2 mm cutting diameter; cutting speed 160 m/min; spindle speed 5000 RPM; cutting feed 0.05 mm/z; feed 0.3 mm/revolution; and coolant volume 16 L/min at 40 bar.

Two of the coated milling tools made it to full life, and the third has a position issue and testing was not completed.

Example 3

Figure 5A:
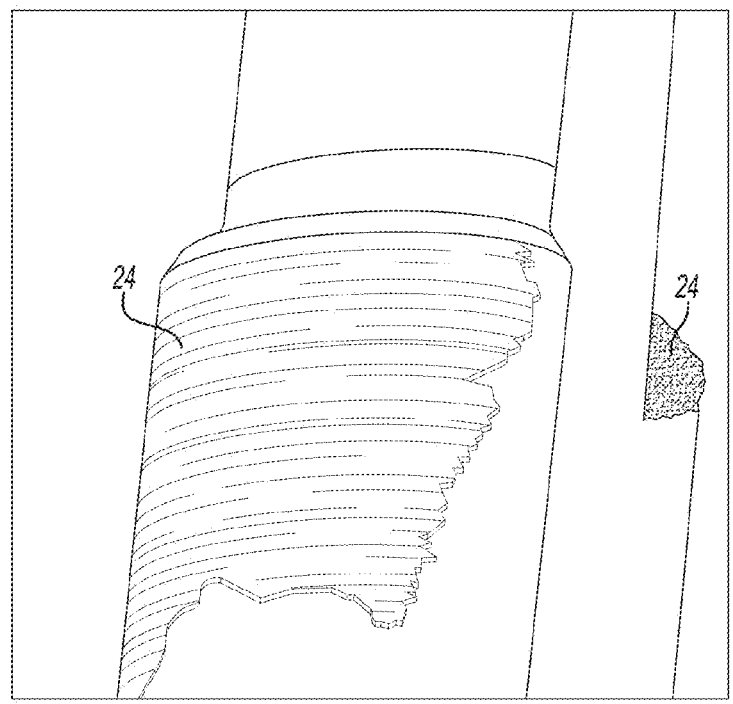
FIG. 5A is a schematic representation of a photograph of an uncoated comparative head bolt taken after the comparative head bolt was used to drill 10,000 holes.

A comparative head bolt drill test was performed. An 8 mm solid carbide gun drill was used with the following parameters: cutting speed 228 m/286 min; spindle speed 7000 RPM; cutting feed 1680 mm/min; and feed per revolution 0.24 mm/z. This uncoated tool was used to make 1,000 parts (10,000 holes) and exhibited extensive aluminum build-up (as schematically shown at reference numeral 24 in FIG. 5A).

Figure 5B:
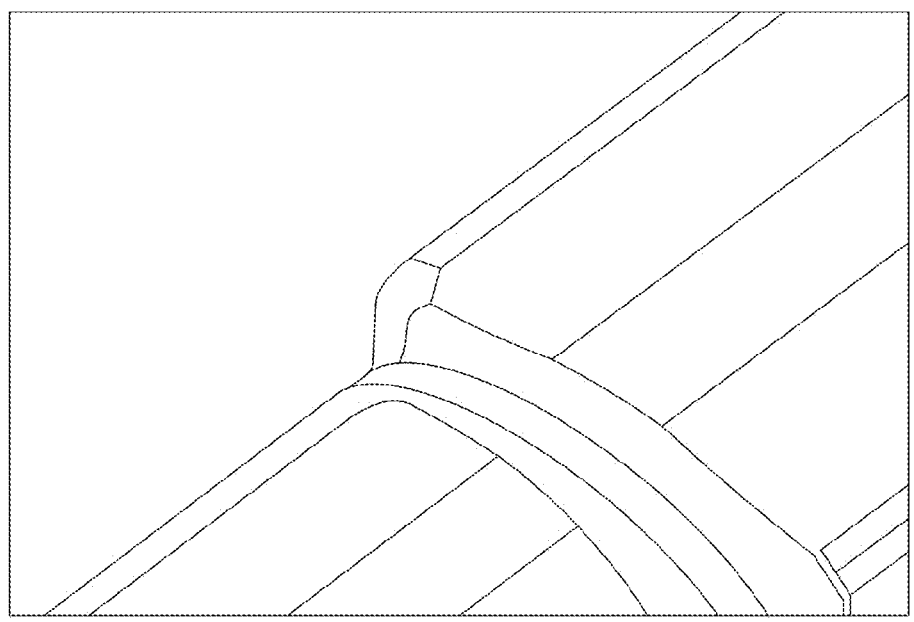
FIG. 5B is a schematic representation of a photograph of an example head bolt (coated with an example of the diamond like coating disclosed herein) taken after the head bolt was used to drill 10,000 holes.

A sample head bolt drill test was also performed. An 8 mm solid carbide gun drill was coated in a similar manner as described in Example 1 to form a non-hydrogenated DLC coating, except that cathodic arc deposition was used instead of magnetron sputtering, and a post-deposition polishing process was used to smooth the DLC coating. The coated drill was used with the following parameters: cutting speed 228 m/286 min; spindle speed 7000 RPM; cutting feed 1680 mm/min; and feed per revolution 0.24 mm/z. This NH-DLC coated tool was used to make 1,000 parts (10,000 holes) and exhibited essentially no aluminum adhesion (as schematically shown in FIG. 5B).

As illustrated in the Examples, the hydrogenated DLC and non-hydrogenated DLC coated tools disclosed herein improve the life cycle of the part and reduce adhesion to the part. These coated tools may be particularly suitable for use in high speed, low feed rate operations, where the cuts made are warm cuts. In addition, while the hydrogenated DLC and non-hydrogenated DLC coatings may be used on any tool, the coatings may be particularly suitable for tools with larger diameters (e.g., greater than 6 mm for a round tool).

It is to be understood that the ranges provided herein include the stated range and any value or sub-range within the stated range. For example, a range from about 0.5 µm to about 6 µm should be interpreted to include not only the explicitly recited limits of about 0.5 µm to about 6 µm, but also to include individual values, such as 0.75 µm, 3.25 µm, 5 µm, etc., and sub-ranges, such as from about 1 µm to about 5.5 µm from about 2 µm to about 4 ηm, etc. Furthermore, when "about" is utilized to describe a value, this is meant to encompass minor variations (up to +/−5%) from the stated value.

In describing and claiming the examples disclosed herein, the singular forms "a", "an", and "the" include plural referents unless the context clearly dictates otherwise.

Additionally, reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

While several examples have been described in detail, it will be apparent to those skilled in the art that the disclosed examples may be modified. Therefore, the foregoing description is to be considered non-limiting.

The invention claimed is:

1. A coated tool, comprising:
   a substrate;
   a metal layer established on the substrate;
   a continuous metal carbide layer established on the metal layer; and
   a smooth, continuous, terminated diamond like carbon (DLC) layer established on the metal carbide layer, the DLC layer being a non-hydrogenated DLC layer terminated with dangling bonds to be passivated;
   wherein the metal layer has a thickness of 10 nm or less, the metal carbide layer has a thickness ranging from about 0.01 µm to about 0.5 µm, and the DLC layer has a thickness ranging from about 0.5 µm to about 6 µm;
   wherein the DLC layer is to prevent metal, from a workpiece upon which the tool is to act, from adhering to the tool.

2. The coated tool as defined in claim 1 wherein the substrate is chosen from WC, WC with a cobalt binder, WC with a nickel binder, steel, and combinations thereof.

3. The coated tool as defined in claim 1 wherein the metal from the metal layer and the metal from the metal carbide layer are each independently selected from Cr, Ti, Zr, W, Ni, and combinations thereof.

4. The coated tool as defined in claim 1 wherein the DLC layer is atomically smooth and has a surface roughness ranging from about 1 nm to about 200 nm.

5. A coated cutting tool, comprising:
   a tungsten carbide substrate;
   a continuous titanium layer established on the tungsten carbide substrate, the continuous titanium layer having a thickness of 10 nm or less;
   a continuous titanium carbide layer established on the continuous titanium layer, the continuous titanium carbide layer having a thickness ranging from about 0.01 µm to about 0.5 µm; and
   a smooth, continuous, terminated diamond like carbon (DLC) layer established on the titanium carbide layer, the DLC layer being a non-hydrogenated DLC layer terminated with dangling bonds to be passivated and having a thickness ranging from about 0.5 µm to about 6 µm;
   wherein the DLC layer is to prevent aluminum, magnesium or both aluminum and magnesium, from a workpiece upon which the tool is to act, from adhering to the tool.

* * * * *